United States Patent
Mordarski et al.

(10) Patent No.: US 8,796,605 B2
(45) Date of Patent: Aug. 5, 2014

(54) HIGH-REPETITION-RATE SINGLE-PHOTON RECEIVER AND METHOD THEREFOR

(75) Inventors: William Paul Mordarski, Colts Neck, NJ (US); Mark Allen Itzler, Princeton, NJ (US)

(73) Assignee: Princeton Lightwave, Inc., Cranbury, NJ (US)

( * ) Notice: Subject to any disclaimer, the term of this patent is extended or adjusted under 35 U.S.C. 154(b) by 293 days.

(21) Appl. No.: 13/464,629

(22) Filed: May 4, 2012

(65) Prior Publication Data

US 2014/0027607 A1   Jan. 30, 2014

(51) Int. Cl.
*G01J 1/44* (2006.01)
*H01J 40/14* (2006.01)

(52) U.S. Cl.
USPC ............ 250/206; 250/214 DC; 250/214.1; 398/196; 327/584

(58) Field of Classification Search
USPC .......... 327/514, 584, 535; 398/189, 196, 206, 398/210
See application file for complete search history.

(56) References Cited

U.S. PATENT DOCUMENTS

| | | | | |
|---|---|---|---|---|
| 5,721,424 | A * | 2/1998 | Price | 250/214 R |
| 7,705,284 | B2 | 4/2010 | Inoue et al. | |
| 2007/0212681 | A1* | 9/2007 | Shapiro et al. | 435/5 |
| 2013/0334434 | A1* | 12/2013 | Nyman et al. | 250/371 |

OTHER PUBLICATIONS

Namekata et al., "800 MHz Single-photon detection at 1550-nm using an InGaAs/InP avalanche photodiode operated with a sine wave gating", "Optics Express", Oct. 16, 2006, vol. 14, No. 21, Publisher: Optical Society of America.

Yuan et al., "High speed single photon detection in the near infrared", "Applied Physics Letters", 2007, vol. 91, Publisher: American Institute of Physics.

Yuan et al., "Multi-gigahertz operation of photon counting InGaAs avalanche photodiodes", "Applied Physics Letters", 2010, vol. 96, Publisher: American Institute of Physics.

Namekata et al., "Ultra-Low-Noise Sinusoidally Gated Avalanche Photodiode for High-Speed Single-Photon Detection at Telecommunication Wave", "IEEE Photonics Technology Letters", 2010, Publisher: IEEE.

* cited by examiner

*Primary Examiner* — Francis M Legasse, Jr.
(74) *Attorney, Agent, or Firm* — Kaplan Breyer Schwarz & Ottesen, LLP (57) ABSTRACT

A single-photon receiver and method for detecting a single-photon are presented. The receiver comprises a SPAD that receives a gating signal having a fundamental frequency in the 100 MHz to multiple GHz range. The receiver further comprises a two-stage frequency filter for filtering the output of the SPAD, wherein the filter has: (1) a notch filter response at the fundamental frequency; and (2) a low-pass filter response whose cutoff frequency is less than the first harmonic of the fundamental frequency. As a result, the frequency filter removes substantially all the frequency components in the SPAD output without significant degradation of the signal quality but with reduced complexity, cost, and footprint requirement relative to receivers in the prior art.

32 Claims, 6 Drawing Sheets

HIGH-REPETITION-RATE SINGLE-PHOTON RECEIVER AND METHOD THEREFOR

STATEMENT REGARDING FEDERALLY-SPONSORED RESEARCH

This invention was made with Government support under W911NF-11-C-0247 awarded by the U.S. Army. The Government has certain rights in the invention.

FIELD OF THE INVENTION

The present invention relates to single-photon detection in general, and, more particularly, to single-photon receiver circuitry.

BACKGROUND OF THE INVENTION

Photodetectors capable of detecting a single photon (i.e., a single "particle" of optical energy) have enabled systems directed toward applications such as single-photon detection and low-light-level imaging. Due to its performance, reliability, cost, and ease of deployment, the semiconductor-based single-photon avalanche diode (SPAD) has been the basis for most of these systems. In recent years, single-photon infrared applications have become of particular interest. As a result, SPADs formed in the indium-gallium-arsenide/indium-phosphide material systems have been a focus of much research and development. Although there has been significant improvement in this device technology over the past several years, single photon receivers have generally been limited to operational rates (i.e., counting rates) below 10 MHz. More recently, however, there has been increased interest in defense applications that require counting rates in the GHz range, such as ultra-secure quantum cryptography systems, quantum information processing, quantum computing, and long distance free-space optical communications. Unfortunately, this combination of high operation rate and wavelength range has historically been difficult, if not impossible, to achieve.

An avalanche photodiode derives its name from the manner in which its output signal is created. When photons are absorbed by an avalanche photodiode, their energy frees bound charge carriers (electrons and holes) that then become free-carrier pairs. In the presence of an electric field (due to a bias voltage applied to the photodiode), these free-carriers are accelerated through a region of the avalanche photodiode referred to as the "multiplication region." As the free carriers travel through the multiplication region, they collide with other carriers bound in the atomic lattice of the semiconductor, thereby generating more free carriers through a process called "impact ionization." These new free-carriers also become accelerated by the applied electric field and generate yet more free-carriers. This avalanche event can occur very rapidly and efficiently and it is possible to generate several hundred million free-carriers from a single absorbed photon in less than one nanosecond.

In order to enable detection of a single photon, a SPAD is biased with a reverse bias voltage having a magnitude greater than the magnitude of its "breakdown voltage," which is the bias level above which free-carrier generation can become self-sustaining and result in run-away avalanche. This is referred to as "arming" the device. When the SPAD is armed, a single free carrier pair created by the absorption of a single photon can create a runaway avalanche resulting in an easily detectable macroscopic current.

Once a photon has been detected, the self-sustained avalanche must be stopped before the arrival of another photon can be detected. Referred to as "quenching," the avalanche is stopped by reducing the magnitude of the applied reverse bias voltage below the magnitude of the breakdown voltage.

In typical operation, a periodic bias signal (referred to as a "gating signal") is applied to a SPAD to arm and quench the device during each bit period. The maximum frequency at which a SPAD can be gated is primarily determined by how fast an avalanche event can be stopped once it is detected and how fast the SPAD can be re-armed once the avalanche event has been quenched.

Unfortunately, the frequency of the gating signal is limited by the fact that not all free carriers are instantaneously swept out of the avalanche region once the device is quenched. With each avalanche event, some fraction of the electrical carriers created will become trapped at defects (e.g., crystalline defects, impurities, etc.) in the multiplication region. These trapped carriers become released in a temporally random manner as a function of temperature, the type of trap state, and applied bias voltage. As a result, the trapped carrier population decays exponentially with time.

Detrapping can occur without consequence while the SPAD remains in its quenched state. If a trapped carrier is released after the SPAD has been re-armed, however, it is likely to trigger an avalanche event that is indistinguishable from one caused by absorption of a photon. Avalanche events induced by carriers created by any mechanism other than photo-excitation (i.e., in the absence of input photons) are referred to as "dark counts," and dark counts caused by the detrapping of trapped carriers in the multiplication region are referred to as "afterpulses." The probability of an afterpulse decays exponentially with the hold-off time between quenching a SPAD and re-arming it, so decreasing the hold-off time leads to a higher probability of afterpulsing.

Afterpulsing represents one of the primary roadblocks to high-rate photon counting. Prior-art methods for reducing afterpulsing have been focused on limiting the charge flow induced by an avalanche event, thereby limiting the number of carriers that can potentially become trapped. One such method relies on the use of a negative-feedback element monolithically integrated with the SPAD to form a negative-feedback avalanche diode (NFAD), such as is described in U.S. Pat. No. 7,719,029 entitled "Negative Feedback Avalanche Photodiode," issued May 18, 2010, and which is incorporated herein by reference. Unfortunately, limiting the charge flow alone leads to additional complications since it results in smaller amplitude signals to be detected. These small signals can be masked by the large transient signals that are generated by the interaction of high-frequency gating signal components with reactance inherent in the SPAD structure. As a result, approaches for high-frequency transient cancellation have been developed in an effort to enable accurate detection of small-amplitude avalanche pulses.

Ideally, a gating signal maximizes the portion of each bit period during which a SPAD is armed, while providing a hold-off time just sufficient to minimize afterpulsing. Further, it is highly desirable to provide gating signals that have fast transitions (i.e., sub-nanosecond) between their low state (quenching bias) and high state (arming bias). Unfortunately, these fast transitions represent high frequency components in the gating signal that serve to generate large capacitive transients in the SPAD. These transients can couple into the SPAD output signal thereby reducing its signal-to-noise ratio. As a result, methods for suppressing these capacitive transients to enable more accurate detection of the typically much smaller signals induced by SPAD avalanche events have been developed. These methods fall into one of two general approaches, after-the-fact cancellation of generated capacitive transients or avoidance of the generation of the capacitive transients in the first place.

One of the more promising methods for avoiding generation of capacitive transients relies on the use of a gating signal devoid of high frequency components—in particular, a sinusoidal gating signal. An example of such a method is described in U.S. Pat. No. 7,705,284, issued Apr. 27, 2010, which is incorporated herein by reference. In this method, a gating signal comprising a D.C. voltage and a substantially pure sinusoidal gating signal is applied to a SPAD. Because the sinusoidal gating signal contains essentially only one frequency component, gating signal components in the SPAD output signal are concentrated at this frequency component and its harmonics. The signal components due to reception of single photons in the SPAD output signal are akin to an impulse response, however. As a result, these photon signal components include frequencies that are widely spread across the frequency spectrum. Relatively straightforward electrical filters can be applied to the SPAD output signal, therefore, to remove the gating signal components and facilitate detection of avalanche events due to reception of a single photons—even when the avalanche amplitude is small. Sinusoidal-gating methods have demonstrated afterpulsing as low as 3.4% with a photon-detection efficiency of approximately 10.5% for SPADs biased with gate signals having a frequency of 2 GHz.

Unfortunately, while the sinusoidal-gating concept simplifies elimination of the gating-signal components, the use of the "top" portion of the sine wave as the SPAD gating bias means that the excess bias changes dramatically throughout a significant fraction of the gate duration. This is due to the fairly shallow slope of the rise and fall of the gate imposed by the simple sine-wave functional form. As a result of the changing excess bias, the photon detection efficiency changes as well. If photon arrivals can be aligned to the relatively "flat" portion of the gate with very low jitter, then the shallow rise and fall times will not be a serious issue. However, for GHz-rate gating with effective gate widths on the order of just 100-200 picosecond (ps), jitter in the photon arrival time of just 50-100 ps can significantly impact the effective photon detection efficiency from one count to the next. As applications demand higher operating frequency, this problem will be exacerbated.

The use of a "squarer" gate signal having more rapid rise and fall times provides a relatively wider portion of bit period in which the bias is "flat." As a result, the photon detection efficiency is relatively constant. Further, a more sharply falling edge of a gating signal provides more rapid avalanche quenching than a smooth sine wave. This results in less charge flow per avalanche, and consequently to a reduction in afterpulsing relative to sinusoidal gating.

As opposed to sinusoidal-gating methods, therefore, some prior-art gating methods derive some of the advantages of faster rise and fall time gate signals by employing square-wave gating signals and addressing the inevitable capacitive transients by canceling them out with additional circuitry. To date, some of the most promising results for transient cancellation have been obtained by employing a "self-differencing" circuit, as described by Yuan, et al., in "Multi-gigahertz operation of photon counting InGaAs avalanche photodiodes," *Applied Physics Letters*, Vol. 96, 071101 (2010), and "High-speed single photon detection in the near infrared," *Applied Physics Letters*, Vol. 91, 041114 (2007), each of which is incorporated herein by reference. In such methods, a square-wave gating signal is applied to a SPAD and the output signal of the SPAD is provided to a 50:50 splitter. The splitter splits the SPAD output signal into two signals, one of which is delayed by exactly one bit period of the gating signal. The delayed signal of a first bit period is then subtracted from the non-delayed signal from the next bit period. As a result, identical capacitive transients produced during sequential gate periods are canceled, leaving only any net avalanche signal that might occur. Self-differencing circuit methods have demonstrated afterpulsing as low as 1.4% with a photon-detection efficiency of approximately 11.8% for SPADs biased with gate signals having a frequency of 2 GHz.

Unfortunately, prior-art SPAD-gating methods have significant drawbacks that have limited their utility in practical single-photon detection systems. These drawbacks include: a need to operation at only a single fixed frequency, which limits their utility in communications applications, among other systems; high residual afterpulsing levels, which limits their signal-to-noise ratio and operating rates; and relatively large form factors, which precludes easy deployment and commercialization.

SUMMARY OF THE INVENTION

The present invention enables single-photon detection at GHz rates and above without some of the drawbacks and limitations of the prior art. Embodiments of the present invention are particularly well suited for use in applications such as quantum cryptography, quantum information processing, quantum computing, and long-distance free-space optical communications.

An illustrative embodiment of the present invention is a single-photon receiver that (1) provides a non-sinusoidal gating signal to a SPAD, wherein the gating signal has a fundamental frequency of approximately 1 GHz and (2) filters the output signal of the SPAD to suppress gating-signal components at the fundamental frequency as well as its harmonics. The output signal is filtered via an electrical filter whose response includes a notch filter response centered at approximately 1 GHz and a low-pass filter whose cutoff frequency is located at approximately 1.9 GHz.

In some embodiments, the gating signal provided to the SPAD is a sinusoid.

In some embodiments, the gating signal provided to the SPAD is tunable over a frequency range thereby enabling receiver operation at a plurality of system data rates, which is particularly critical for communications applications.

In some embodiments, the center frequency and/or width of the notch filter response is tunable while the cutoff frequency of the low-pass filter is fixed. In such embodiments, frequency tuning is limited to less than one octave.

In some embodiments, the cutoff frequency of the low-pass filter response is tunable, thus frequency tuning of more than one octave can be achieved.

An embodiment of the present invention comprises an apparatus comprising: a voltage source operative to bias a single-photon avalanche diode with a gating signal that has a first component characterized by a first frequency; and a first filter that is dimensioned and arranged to provide an output signal based on an input signal from the avalanche photodiode, the first filter having a filter response characterized by (1) a low-pass filter response having a cutoff frequency that is less than twice the first frequency and (2) a notch filter response centered at a center frequency, wherein the notch filter response attenuates a first frequency range that includes the first frequency.

DETAILED DESCRIPTION

The following terms are defined for use in this Specification, including the appended claims:

A single-photon avalanche diode is defined as an avalanche photodiode that is dimensioned and arranged to enable the generation of a detectable macroscopic current signal upon receipt of a single photon when biased with a bias voltage that exceeds its breakdown voltage. A single-photon avalanche diode has a layer structure and explicit device design features that enable it to exhibit lower dark counts and less afterpulsing than a conventional avalanche photodiode.

A gating signal is defined as a periodic signal applied to a SPAD to temporarily bring the magnitude of its reverse bias voltage above the magnitude of its breakdown voltage. As a result, a gating signal alternately arms and quenches the SPAD at a rate that depends on the frequency of the gating signal.

Figure 1:
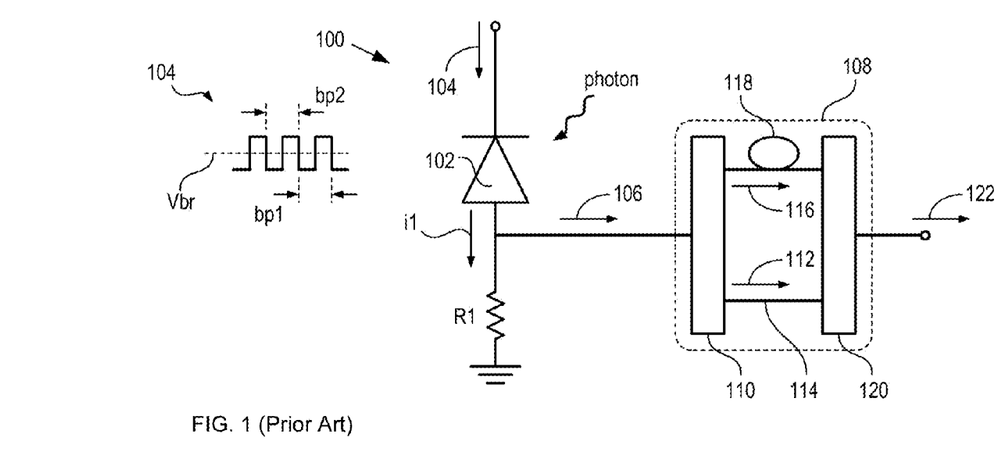
FIG. 1 depicts a schematic drawing of a single-photon receiver comprising a self-differencing circuit for canceling capacitive transients in accordance with the prior art.

FIG. 1 depicts a schematic drawing of a single-photon receiver comprising a self-differencing circuit for canceling capacitive transients in accordance with the prior art. Receiver 100 comprises SPAD 102, resistor R1, and self-differencing circuit 108.

SPAD 102 is an avalanche photodiode adapted for single-photon detection. SPAD 102 is biased with gating signal 104, which alternately arms and quenches SPAD 102 during each bit period.

Figure 2:
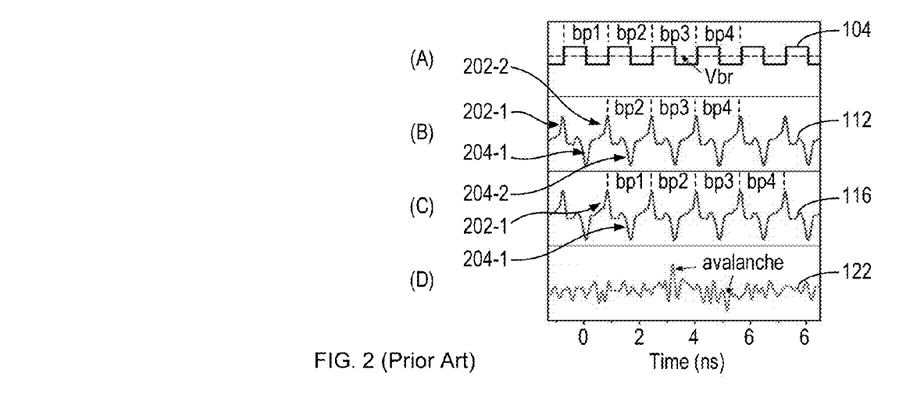
FIG. 2A depicts gating signal 104 of receiver 100 versus time.
FIG. 2B depicts first signal 112 of receiver 100 versus time, in the absence of a received photon at SPAD 102.
FIG. 2C depicts second signal 116 of receiver 100 versus time, in the absence of a received photon at SPAD 102.
FIG. 2D depicts output signal 122 versus time in response to receipt of a photon.

FIG. 2A depicts gating signal 104 of receiver 100 versus time. Gating signal 104 is a square-wave voltage signal having a fundamental frequency of 1 GHz. Typically, gating signal 104 includes a D.C. voltage level that is slightly below the breakdown voltage of SPAD 102. Within each bit period, bp, the magnitude of gating signal 104 exceeds the magnitude of breakdown voltage Vbr for the first half of bit period by and is below Vbr for the second half of bit period bp. As a result, SPAD 102 is armed for the first half of each bit period and is quenched for the second half of each bit period. SPAD 102 provides current signal i1, which produces voltage signal 106 across resistor R1. Voltage 106 is provided to the input of self-differencing circuit 108.

Self-differencing circuit 108 includes 50:50 splitter 110, transmission line 114, delay line 118, and differencer 120.

Splitter 110 evenly splits voltage signal 106 into first signal 112 on transmission line 114 and second signal 116 on delay line 118, which delays second signal 116 by exactly one bit period. In some prior-art self-differencing circuits, delay line 118 includes an adjustable delay element, such as a coaxial line stretcher, that enables a slightly tunable delay so that small errors in the fundamental frequency of gating signal 104 can be accommodated. The amount of delay provided for this purpose is very small, however, since the variation in gating signal frequency is typically only over a range of a few tens of MHz (e.g., from 0.987 GHz to 1.033 GHz).

Differencer 120 is an amplifier that receives first signal 112 and second signal 116 and provides output signal 122 based on the difference of these two signals.

FIGS. 2B and 2C depict first signal 112 and second signal 116 of receiver 100, respectively, versus time, in the absence of a received photon at SPAD 102. In the absence of a received photon, voltage signal 106 should be a D.C. voltage level of approximately zero volts; however, the fast rise and fall times of gating signal 104 represent higher frequency components that induce capacitive transients on the signal. Specifically, each rising edge of gating signal 104 induces a positive transient 202 in each bit period (e.g., positive transients 202-1 and 202-2 in bit periods bp1 and bp2, respectively) and a negative transient 204 in each bit period (e.g., negative transients 204-1 and 204-2 in bit periods bp1 and bp2, respectively).

Since each bit period of gating signal 104 is virtually identical, the gating-signal induced content of voltage signal 106 is also identical in each bit period. As a result, bit-period bp1 of delayed second signal 116 is substantially identical to bit-period bp2 of non-delayed first signal 112. Transients 202-1 and 204-1 in second signal 116, therefore, are identical to positive transients 202-2 and 204-2 in first signal 112. As a result, in the absence of a received photon, differencer 120 provides output voltage 122 as a substantially net zero voltage (in the ideal case).

When a photon is received by SPAD 102, however, it induces an avalanche event that results in a substantial voltage spike on voltage signal 106. FIG. 2D depicts output signal 122 versus time in response to receipt of a photon. Output signal 122 shows the effect of the receipt of a photon by SPAD 102 during bit period bp3. Since differencer 120 subtracts bit period bp2 of second signal 116 from bit period bp3 of first signal 112, the avalanche event due to the receipt of the photon can be easily detected. It should be noted that output signal 122 includes a negative voltage spike in bit period bp4 due to the one bit period propagation delay of the avalanche event in second signal 116.

Unfortunately, self-differencing circuits are limited in a number of ways. First, they are inherently restricted to a single operating frequency, although slight variation of operating frequency for compensation of gating frequency variation has been reported. Second, the cost and complexity of the splitter, delay element, and differencer add significant expense and foot print to a self-differencing receiver, making a commercially viable, easily deployed module impractical in many applications.

Figure 3:
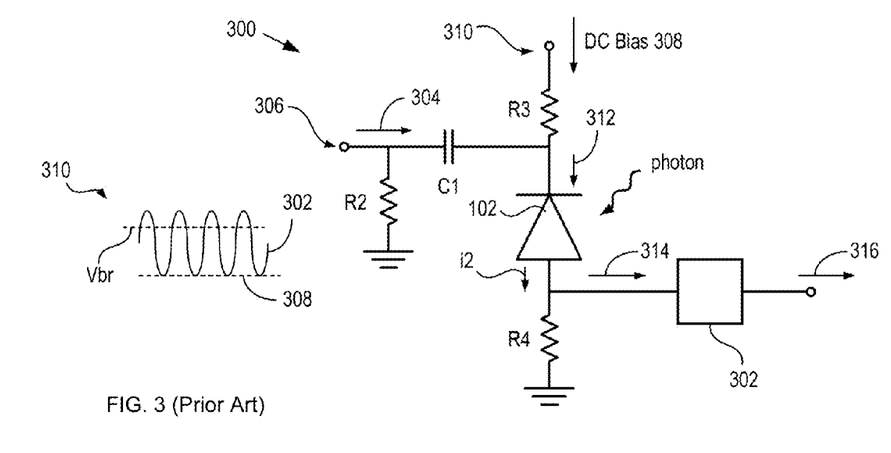
FIG. 3 depicts a schematic drawing of a single-photon receiver that is operable with sinusoidal gating in accordance with the prior art.

FIG. 3 depicts a schematic drawing of a single-photon receiver that is operable with sinusoidal gating in accordance with the prior art. Receiver 300 employs a sinusoidal gating signal so as to avoid generation of capacitive transients. Receiver 300 comprises SPAD 102, resistors R2, R3, and R4, coupling capacitor C1, and band-rejection filter 302. SPAD 102 is biased with bias signal 312, which is a combination of gating signal 304, provided at node 306, and DC bias voltage 308, provided at node 310.

Figure 4:
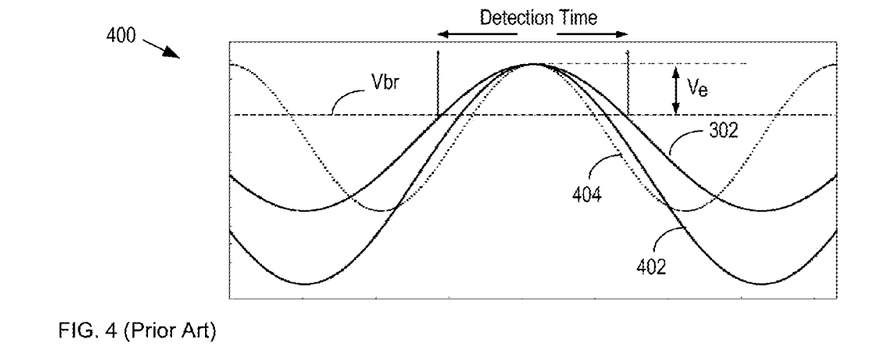
FIG. 4 depicts examples of sinusoidal gating signals suitable for use with receiver 300.

FIG. 4 depicts examples of sinusoidal gating signals suitable for use with receiver 300. Gating signal 404 is a sinusoidal voltage signal having a fundamental frequency of approximately 250 MHz. Within each bit period, the amount of time SPAD 102 can detect a photon (i.e., its detection time) is based on the amplitude and frequency of gating signal 304. Specifically, while the magnitude of gating signal 304 exceeds the magnitude of breakdown voltage Vbr, SPAD 102 is armed. For the remainder of each bit period, SPAD 102 is in a quenched state and unable to detect the arrival of a photon.

SPAD 102 provides current signal i2, which develops voltage signal 314 across resistor R4. Voltage signal 314 is provided to the input of band-rejection filter 302.

Band-rejection filter 302 is a filter comprising a plurality of notch filters that are located at the fundamental frequency of gating signal 304 and one or more of its harmonics. As a result, band-rejection filter 302 provides output signal 316 by removing only the gating signal components in voltage signal 314, while enabling the spectral content associated with a received photon to pass through the filter. As discussed in U.S. Pat. No. 7,705,284, the operation of receiver 300 depends on the fact that gating signal 304 is a substantially pure sine wave, which results in the gating signal components in voltage signal 314 being sine waves as well. The operation of receiver 300 further relies on the fact that the optical detection signal that results from receipt of a photon is an impulse; therefore, its various frequency components are spread widely in the frequency spectrum. As a result, the impulse signal associated with the receipt of a photon by SPAD 102 passes through band-rejection filter 302 with only slight loss, while the filter suppresses the sinusoidal component of the gating signal in voltage signal 314 to produce output signal 316.

Unfortunately, like the self-differencing approach described above, sinusoidal gating methods are limited in several important ways. First, the detection time within each bit period is determined by the amount of each wavelength of gating signal 304 that exceeds breakdown voltage Vbr. The magnitude of this excess voltage, Ve, determines the photon detection efficiency of the receiver. Ideally, the photon detection efficiency is relatively stable; however, since the magnitude of sinusoidal gating signal 304 is constantly changing, so too does the photon detection efficiency of receiver 300.

Relatively constant photon detection efficiency can be obtained, however, by limiting the detection time (i.e., gate width) to only that portion of gating signal 304 having a relatively "flat" portion. For applications requiring high frequency operation (i.e., GHz and above), however, this would result in an effective gate width of only 100-200 picoseconds. As a result, timing jitter (commonly 50-100 ps) can affect effective photon detection efficiency from one count to the next. Further, as the frequency of gating signal 304 increases, the length of the detection time is further reduced—exacerbating the timing jitter issue. Further, by limiting the gate width to only the relatively flat peak portion of gating signal 304, the duty factor of receiver 300 is reduced.

Second, because band-rejection filter 302 has a fixed frequency response, receiver 300 is not frequency-agile. As a result, its utility in many communications applications is limited.

It is an aspect of the present invention that the use of a frequency-tunable gating signal and a filter whose response is frequency tunable enables single-photon detection at a plurality of communications frequencies.

It is a further aspect of the present invention that the use of a simple low-pass filter to attenuate frequencies at and above the first harmonic frequency reduces noise in the output signal of a receiver without significantly degrading the desired signal content of an avalanche event resulting from a received photon. The concept of using a low-pass filter in this way arose from an unexpected determination by the inventors, based on the results of experimentation, that the bulk of the spectral weight of an avalanche that arises from receipt of a single photon is below the fundamental gating frequency. This surprising result is in contrast to the teachings of the prior art, in which the information content from an avalanche arising from the receipt of a photon is characterized as including frequency components spread widely in spectrum—below and above the first harmonic frequency. As a result, prior art methods, such as those disclosed in U.S. Pat. No. 7,705,284, encompass attempt to include frequency components above the first harmonic by employing a plurality of complex notch filters (relative to a simple low-pass filter) that suppress only those frequencies immediately around each of the fundamental frequency and its first harmonic frequency.

Figure 5:
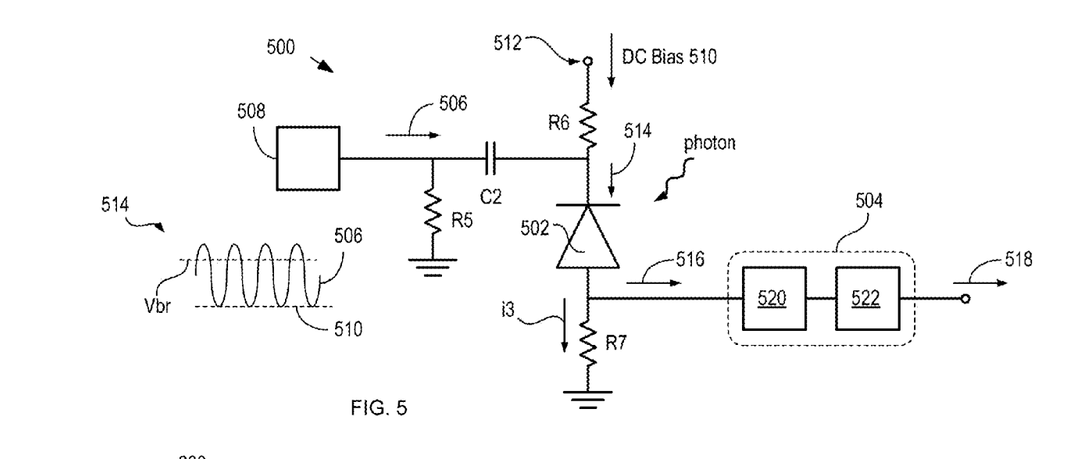
FIG. 5 depicts a schematic drawing of a single-photon receiver in accordance with an illustrative embodiment of the present invention.

FIG. 5 depicts a schematic drawing of a single-photon receiver in accordance with an illustrative embodiment of the present invention. Receiver 500 comprises SPAD 502, resistors R5, R6, and R7, coupling capacitor C2, frequency filter 504, and gating signal generator 508.

SPAD 502 is analogous to SPAD 102, described above and with respect to FIG. 1. In some embodiments, SPAD 502 is a negative-feedback avalanche diode (NFAD) that comprises a monolithically integrated feedback element, such as a resistor, inductor, or active element, which enables rapid quenching of an avalanche after detection of a photon.

Resistors R5, R6, and R7 are conventional resistors having resistances of approximately 50Ω, 1000Ω, and 50Ω, respectively. Resistor R7 acts as a load resistor for SPAD 502, enabling it to provide voltage signal 506 based on current signal i3. One skilled in the art will recognize that the values provided for resistors R5, R6, and R7 are merely exemplary and that these values are matters of design.

Coupling capacitor C2 is a conventional capacitor having a capacitance value suitable for coupling gating signal 506 to SPAD 502.

Figure 6:
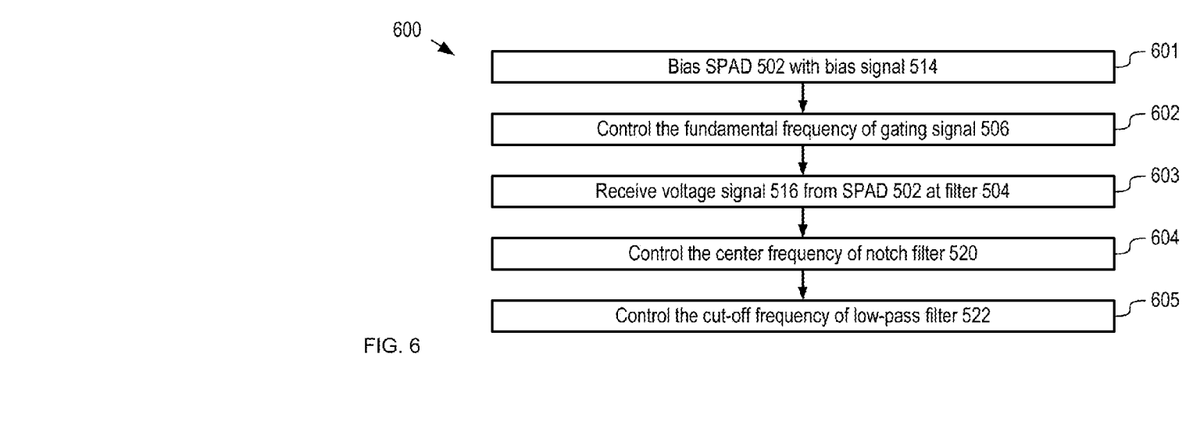
FIG. 6 depicts operations of a method for single-photon detection in accordance with the illustrative embodiment of the present invention.

FIG. 6 depicts operations of a method for single-photon detection in accordance with the illustrative embodiment of the present invention. Method 600 begins with operation 601, wherein SPAD 502 is biased with bias signal 514.

Gating signal generator 508 generates sinusoidal gating signal 506. DC bias voltage 510 is provided at node 512 and combined with gating signal 506 as bias signal 514. Typically, DC bias voltage 510 is within the range of approximately 50 V to approximately 70 V, however, one skilled in the art will recognize that DC bias voltage can be any voltage suitable for enabling gating signal 506 to arm and quench SPAD 502 at desired repetition rate.

Gating signal 506 is a sine-wave voltage signal having a fundamental frequency, $f_0$, of approximately 500 MHz. Gating signal 506 has an amplitude such that, in combination with DC bias voltage 510, it provides bias signal 512 having a duty factor (the percentage of each bit period during which SPAD 502 is armed) of approximately 10%. In some embodiments, gating signal 506 and DC bias voltage 510 provide bias signal 512 having a duty factor anywhere within the range of approximately 10% to approximately 90%. Gating signal 506 is controllable such that $f_0$ can be tuned to any frequency within the range of approximately 500 MHz to 1000 MHz.

At operation 602, the fundamental frequency of gating signal 506 is controlled within a tuning range from approximately 500 MHz to approximately 1000 MHz (i.e., approximately one octave).

At operation 603, filter 504 receives voltage signal 516 from SPAD 502. Filter 504 is a frequency filter that receives voltage signal 516, suppresses undesired frequency content by attenuating those frequencies by at least a rejection threshold, and provides output signal 518. Filter 504 comprises two filter stages—notch filter 520 and low-pass filter 522. For the purposes of this Specification, including the appended claims, the term "rejection threshold" is defined as a user-defined level of attenuation suitable for substantially removing a portion of an input signal from the output signal of a filter. In the illustrative embodiment, filter 504 has a rejection threshold of 30 dB; however, one skilled in the art will recognize that the required rejection threshold of filter 504 is application dependent. In some embodiments of the present invention, a rejection threshold within the range of approximately 5 dB to approximately 30 dB is sufficient for providing suitable frequency rejection. In other embodiments of the present invention, a rejection threshold that is greater than 30 dB (e.g., 40 dB, 50 dB, etc.) is necessary to provide sufficient frequency suppression.

Notch filter 520 is a tunable filter that provides rejection of at least the rejection threshold over a continuous frequency band centered at a center wavelength. In the illustrative embodiment, the response of notch filter 520 controllable such that its center frequency can be tuned to any frequency within the range of approximately 500 MHz to approximately 1000 MHz while maintaining a notch width within the range of approximately 30 MHz to approximately 50 MHz. One skilled in the art will recognize that the width of typical commercially available tunable notch filter is dependent upon the frequency at which it is centered.

At operation 604, the center frequency of notch filter 520 is controlled such that it matches fundamental frequency, $f_0$. In some embodiments, notch filter 520 is controlled to suppress a continuous range of frequencies that includes, but is not centered at, $f_0$. It should be noted that the tunability of notch filter affords receiver 500 advantages over prior-art single-photon receivers because it enables receiver operation at any of a plurality of communications frequencies.

Figure 7:
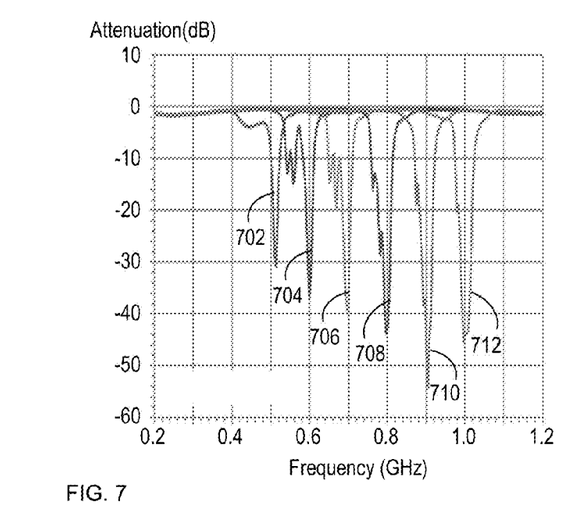
FIG. 7 depicts a measured filter response for notch filter 520.

FIG. 7 depicts a measured filter response for notch filter 520. Filter responses 702, 704, 706, 708, 710, and 712 show the frequency response of notch filter 520 in approximately 100 MHz steps over its one octave tuning range from 500 MHz to 1000 MHz.

Although in the illustrative embodiment gating frequency 506 and notch filter 520 are tunable over a frequency range of approximately 1 octave, it will be clear to one skilled in the art, after reading this Specification, how to specify, make, and use embodiments wherein gating frequency 506 and notch filter 520 are tunable over any practically realizable frequency range. In some embodiments, gating frequency 506 and notch filter 520 are tunable over a frequency range greater than one octave. In some embodiments, gating frequency 506 and notch filter 520 are tunable over a frequency range less than one octave.

At operation 605, low-pass filter 522 is controlled based on the fundamental frequency of gating signal 506. Low-pass filter 522 is a tunable low-pass filter having a cutoff frequency, $f_c$, and an associated rejection frequency, $f_r$. As one skilled in the art will recognize, the cutoff frequency of a low-pass filter is the frequency at which its attenuation response is equal to −3 dB. For the purposes of this Specification, including the appended claims, "rejection frequency" is defined as the frequency at which the attenuation response of a low-pass filter is equal to the rejection threshold of its corresponding filter. One skilled in the art will recognize that the frequency separation between the cutoff frequency and rejection frequency of a low-pass filter is filter-design dependent and low-pass filter designs are achievable (e.g., Chebyshev filters, Butterworth filters, etc.) wherein the two frequencies are nearly the same.

Low-pass filter 522 is tunable such that the rejection frequency, $f_r$, can be maintained at a frequency that is less than the first harmonic of fundamental frequency, $f_0$, as the fundamental frequency is tuned. In some embodiments, the rejection frequency of low-pass filter 522 is located at approximately $1.9 * f_0$ to ensure sufficient suppression of contributions of the first harmonic to voltage signal 516. Since the rejection frequency of low-pass filter 522 is tunable, the full approximately one octave tunability of gating signal 506 and notch filter 520 can be exploited.

As mentioned previously, prior-art frequency filters include a plurality of complicated notch filters centered at the fundamental frequency of the gating signal and one or more of its harmonics to selectively remove these spectral components from the output of a SPAD. Notch filters are used to preserve the content of the avalanche pulses that arise from receipt of photons, which heretofore has been considered to include important spectral content located at frequencies above the first harmonic of the gating signal. It is an aspect of the present invention, however, that a simple low-pass filter whose rejection frequency is located just below the first harmonic of the gating signal frequency can replace the harmonics-centered notch filters without significant loss of sensitivity for single-photon reception. As a result, the overall complexity of filter 504, as well as its footprint and cost, can be reduced as compared to frequency filters of the prior art.

Prior to the present invention, it has been a widespread belief that elimination of signal content higher than the first harmonic of the gating signal would remove too much of the content of an avalanche event due to a received photon. In contrast to this belief, however, the present invention exploits the fact that most of the spectral weight of this content lies somewhat below 1 GHz. For gating signals having a fundamental frequency of 500 MHz and above, therefore, this spectral content is well within the first harmonic of the gating signal frequency.

Figure 8:
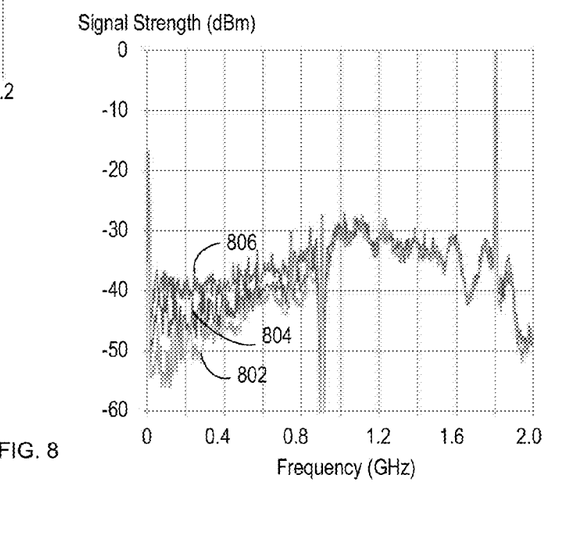
FIG. 8 depicts measured spectral density for receiver 500, with low-pass filter 522 removed, at different incident optical power levels.

FIG. 8 depicts measured spectral density for receiver 500, with low-pass filter 522 removed, at different incident optical power levels. Plots 802, 804, and 806 were generated using a gating signal 506 having a fundamental frequency of 900 MHz and with notch filter 520 tuned such that its center wavelength was 900 MHz.

Plot 802 shows the spectral density of voltage signal 516 in the absence of illumination (i.e., a dark signal). Plot 804 shows the spectral density of voltage signal 516 for a series of optical pulses incident on SPAD 502, where each pulse contains a single photon. Plot 806 shows the spectral density of voltage signal 516 for a series of optical pulses incident on SPAD 502, where each pulse contains ten photons. Upon examination of FIG. 8, it is clear that plots 802, 804, and 806 diverge below approximately 1 GHz, but converge at or above this frequency. It is clear, therefore, that virtually all of the signal information of a photon-induced avalanche is at or below 1 GHz.

Figure 9A:
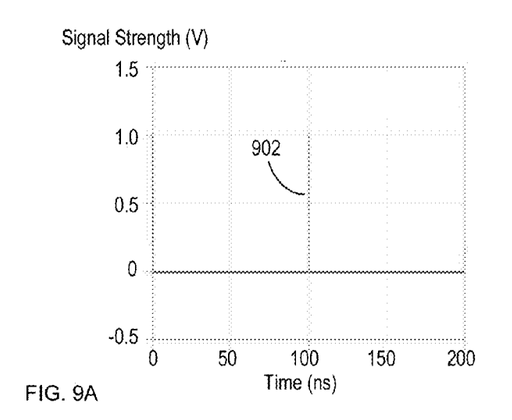
FIG. 9A depicts a simulated pulse response induced by the receipt of a photon at a single-photon receiver in the time domain.
Figure 9B:
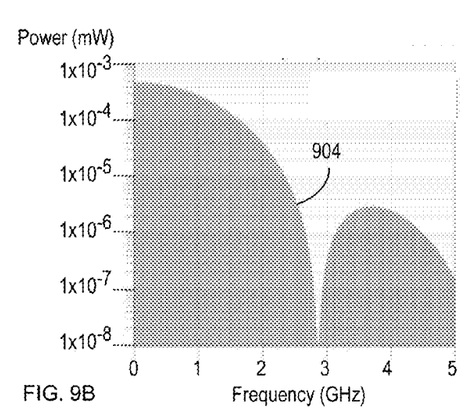
FIG. 9B depicts a simulated pulse response induced by the receipt of a photon at a single-photon receiver in the frequency domain.

FIGS. 9A and 9B depict a simulated pulse response induced by the receipt of a photon at a single-photon receiver in the time domain and frequency domain, respectively.

Time-domain pulse response 902 is characterized by a 100-picosecond rise time, a 100-picosecond fall time, and a "flat-top" width of 300 picoseconds.

Spectral density plot 904 further supports a conclusion that the information content of a pulse from a received photon is heavily weighted toward frequencies below 2 GHz (note the logarithmic scale of the spectral density plot 904). In fact, for a gating signal having a fundamental frequency of 1 GHz, the bulk of the information content for a photon-induced pulse is located below the first harmonic of the fundamental frequency.

Figure 9C:
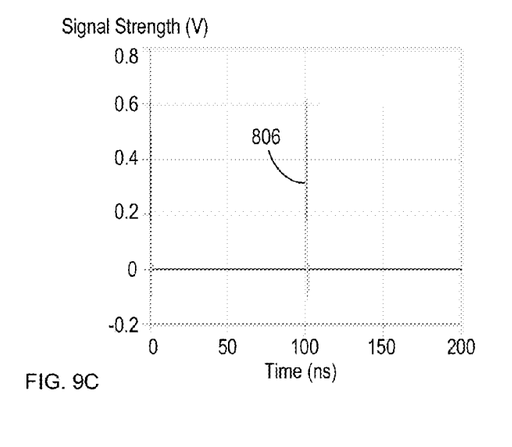
FIG. 9C depicts a simulated output signal based on pulse response 902 after application of a relatively low-Q notch filter.

FIG. 9C depicts a simulated output signal based on pulse response 902 after application of a relatively low-Q notch filter. Time-domain pulse response 906 shows the effect induced on the signal by a notch filter centered at 1 GHz, where the notch filter has a Q of 200. Time-domain pulse response 906 shows a reduction of approximately 40% of the input pulse. In addition, a small portion of the signal energy is lost to ringing that manifests at a slightly higher frequency.

Figure 9D:
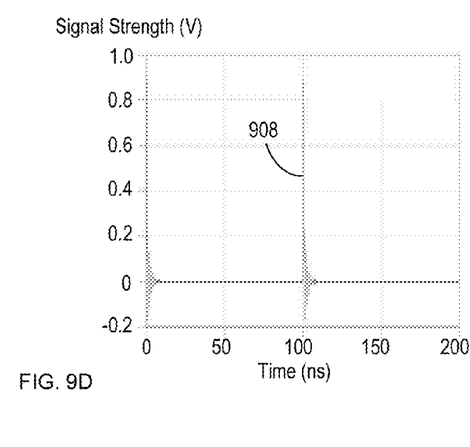
FIG. 9D depicts a simulated output signal based on pulse response 902 after application of a relatively high-Q notch filter.

FIG. 9D depicts a simulated output signal based on pulse response 902 after application of a relatively high-Q notch filter. Time-domain pulse response 908 shows the effect induced on the signal by a notch filter centered at 1 GHz, where the notch filter has a Q greater than 1000. Time-domain pulse response 908 shows significant improvement over pulse response 906, with approximately 50% improvement in peak signal strength (to approximately 90% of pulse response 902) but increased ringing on the baseline.

In some embodiments, the rejection frequency of low-pass filter 522 is not controllable. In such embodiments, the low-pass filter is designed to have a fixed rejection frequency that is less than twice the lowest possible fundamental frequency for gating signal 506. It should be noted, however, that such embodiments have a limited operating frequency range because $f_0$ cannot be tuned over a complete octave without significant loss of signal strength.

Although gating signal 506 is a sinusoidal gating signal, it is yet another aspect of the present invention that frequency filtering can be used to enable the use of a non-sinusoidal gating signal. Frequency filtering in accordance with the present invention limits the adverse effects of capacitive transients induced by the high-frequency components associated with the fast rise and fall times of a non-sinusoidal gating signal. Specifically, the use of a filter having both a notch filter response at the fundamental frequency of a non-sinusoidal gating signal and a low-pass filter whose cutoff frequency below the first harmonic of the fundamental frequency can improve the signal-to-noise ratio of a single-photon receiver without incurring the limitations imposed by sinusoidal gating methods.

As discussed above and with respect to FIG. 3, sinusoidal gating is attractive because of the absence of higher frequency content; however, the use of only the "top" portion of the sine wave as the SPAD gating bias results in an excess bias that changes throughout a significant fraction of period when the SPAD is armed. This leads to potential problems with jitter in the photon arrival time, which can significantly impact the effective photon detection efficiency from one count to the next. As a result, non-sinusoidal gating signals are attractive since they enable the use of a relatively wider portion of the bit period in which the bias is "flat" so that the photon detection efficiency remains relatively constant. Non-sinusoidal gating signals are also attractive alternatives to sine-wave gating signals because a sharper falling edge is more likely to rapidly quench the gated SPAD, which would result in less charge flow per avalanche and a commensurate decrease in afterpulsing.

Figure 10:
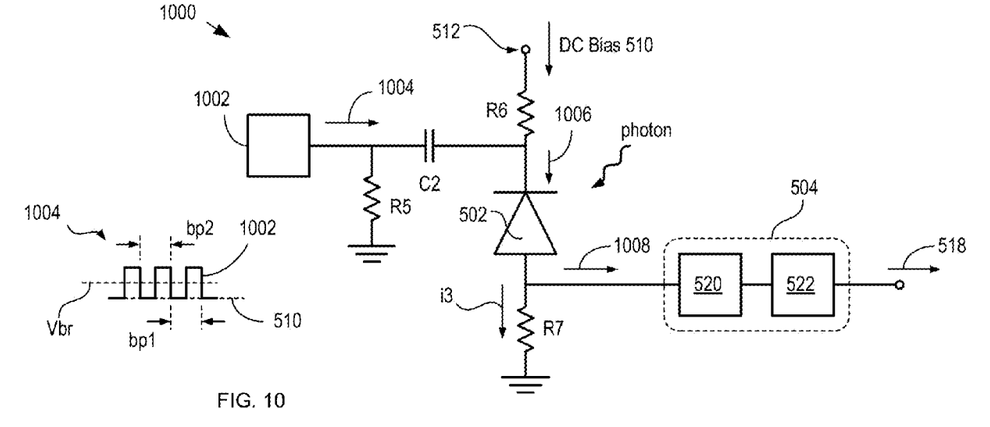
FIG. 10 depicts a schematic drawing of a single-photon receiver that employs a non-sinusoidal gating signal in accordance with an alternative embodiment of the present invention.

FIG. 10 depicts a schematic drawing of a single-photon receiver that employs a non-sinusoidal gating signal in accordance with an alternative embodiment of the present invention. Receiver 1000 comprises SPAD 502, resistors R5, R6, and R7, coupling capacitor C2, frequency filter 504, and gating signal generator 1002.

Gating signal generator 1002 generates sinusoidal gating signal 1004. DC bias voltage 510 is provided at node 512 and combined with gating signal 1004 as bias signal 1006.

Gating signal 1004 is a substantially square-wave signal having a fundamental frequency, $f_1$, of 1 GHz. Gating signal 1004 has amplitude such that, in combination with DC bias voltage 510, it provides bias signal 1006 having a duty factor of approximately 10%. and a duty factor of approximately 10%. In some embodiments, gating signal 1004 has a duty factor other than 10%. In some embodiments, gating signal 1004 has a duty factor that is within the range of approximately 10% to approximately 90%. Because gating signal 1004 is a non-sinusoidal gating signal, it includes frequency components well above the fundamental frequency. As discussed earlier with respect to FIG. 1, these higher-frequency components serve to induce capacitive transients on voltage signal 1008. Gating signal 1004 is controllable such that $f_1$ can be tuned to any frequency within the range of approximately 750 MHz to 1500 MHz.

Figure 11:
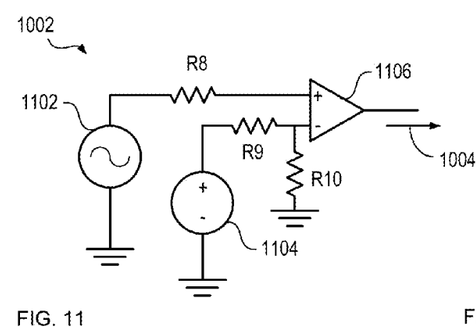
FIG. 11 depicts a schematic drawing of a gating signal generator in accordance with the alternative embodiment of the present invention.

FIG. 11 depicts a schematic drawing of a gating signal generator in accordance with the alternative embodiment of the present invention. Gating signal generator 1002 comprises AC source 1102, DC source 1104, comparator 1106, and resistors R8, R9, and R10.

AC source 1102 is a tunable high-frequency sine-wave generator for providing signals at frequencies within the range of 100 MHz to approximately 20 GHz. AC source 1102 provides a sine-wave signal at 1 GHz to the positive input of comparator 1106.

DC source 1104 provides a DC voltage suitable for use as reference voltage at the negative input of comparator 1106.

Comparator 1106 is a high-speed comparator operable to generate an output signal having frequency within the range of 100 MHz to 20 GHz. Comparator 1106 provides gating signal 1004 such that it has a high voltage level when the voltage level of the output of AC source 1102 exceeds the voltage provided by DC source 1104.

Figure 12:
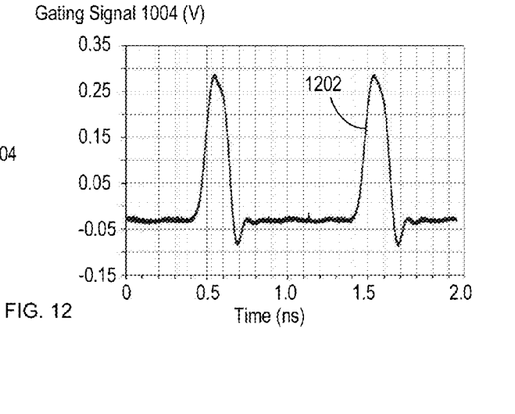
FIG. 12 depicts a plot of gating signal 1004. Gating signal 1004 includes a pulse train, wherein each pulse 1202 is characterized by a very fast rise and fall time and a width of approximately 100 picoseconds.

FIG. 12 depicts a plot of gating signal 1004. Gating signal 1004 includes a pulse train, wherein each pulse 1202 is characterized by a very fast rise and fall time and a width of approximately 100 picoseconds. In some embodiments, the rise and fall time of pulse 1202 is within the range of approximately 20 picoseconds to approximately 40 picoseconds.

In operation, receiver 1000 is analogous to receiver 500. Notch filter 520 suppresses frequencies in a notch centered at 1 GHz, while low-pass filter 522 suppresses frequencies above a cutoff frequency of less than 2 GHz. In some embodiments, the rejection frequency of low-pass filter 522 is approximately 1.9 GHz.

In some embodiments, low-pass filter 522 is tunable to enable a tuning range of at least one octave for fundamental frequency $f_1$. In some embodiments, low-pass filter 522 is not tunable and the tuning range of $f_1$ is restricted to less than one octave.

It is to be understood that the disclosure teaches just one example of the illustrative embodiment and that many variations of the invention can easily be devised by those skilled in the art after reading this disclosure and that the scope of the present invention is to be determined by the following claims.

What is claimed is:

1. An apparatus comprising:
   a voltage source operative to bias a single-photon avalanche diode with a gating signal that is characterized by a fundamental frequency; and
   a first filter that is dimensioned and arranged to provide an output signal based on an input signal from the avalanche photodiode, the first filter having a filter response characterized by (1) a low-pass filter response having a rejection frequency that is less than twice the fundamental frequency and (2) a notch filter response centered at a center frequency, wherein the notch filter response attenuates a first frequency range that includes the fundamental frequency.

2. The apparatus of claim 1 further comprising the single-photon avalanche diode.

3. The apparatus of claim 1 wherein the fundamental frequency is controllable and the center frequency is controllable.

4. The apparatus of claim 3 wherein the rejection frequency is controllable.

5. The apparatus of claim 4 wherein each of the fundamental frequency and the center frequency is controllable over a frequency range that is equal to or greater than one octave.

6. The apparatus of claim 1 wherein the gating signal is a sinusoidal signal.

7. The apparatus of claim 1 wherein the rejection frequency is greater than or equal to approximately 1.9 times the fundamental frequency.

8. The apparatus of claim 1 wherein the width of the first frequency range is controllable.

9. An apparatus comprising:
   a voltage source operative to bias a single-photon avalanche diode with a gating signal that is non-sinusoidal and is characterized by a fundamental frequency; and
   a first filter that is dimensioned and arranged to provide an output signal based on an input signal from the avalanche photodiode, the first filter having a filter response characterized by (1) a low-pass filter response having a rejection frequency that is less than twice the fundamental frequency and (2) a notch filter response centered at a center frequency, wherein the notch filter response attenuates a first frequency range that includes the fundamental frequency.

10. The apparatus of claim 9 wherein each of the fundamental frequency and first frequency range is controllable, and wherein the rejection frequency is substantially fixed.

11. The apparatus of claim 9 wherein each of the fundamental frequency, first frequency range, and rejection frequency is controllable.

12. The apparatus of claim 11 wherein each of the fundamental frequency and the center frequency is controllable over a frequency range that is equal to or greater than one octave.

13. An apparatus comprising:
    a single-photon avalanche diode;
    a voltage source operative to bias the avalanche photodiode with a gating signal that is characterized by a fundamental frequency; and
    a first filter that is dimensioned and arranged to provide an output signal based on an input signal from the single-photon detector, the first filter being characterized by a rejection threshold and a filter response that attenuates by at least the rejection threshold (1) frequencies in a first frequency range that includes the fundamental frequency and (2) all frequencies above a first frequency that is less than twice the fundamental frequency.

14. The apparatus of claim 13 wherein the gating signal is a non-sinusoidal signal and each of the fundamental frequency, the first frequency range, and the first frequency is fixed.

15. The apparatus of claim 13 wherein each of the fundamental frequency and first frequency range is controllable, and wherein the first frequency is substantially fixed.

16. The apparatus of claim 15 wherein the gating signal is a sinusoidal signal.

17. The apparatus of claim 13 wherein each of the fundamental frequency, first frequency range, and the first frequency is controllable.

18. The apparatus of claim 17 wherein the fundamental frequency is controllable over a frequency range that is equal to or greater than one octave.

19. The apparatus of claim 18 wherein the gating signal is a sinusoidal signal.

20. The apparatus of claim 13 wherein the first frequency is greater than or equal to approximately 1.9 times the fundamental frequency.

21. A method comprising:
    providing a gating signal to a single-photon avalanche diode, the gating signal being characterized by a fundamental frequency; and
    filtering an output signal provided by the single-photon avalanche diode with a filter having a filter response characterized by (1) a low-pass filter response that attenuates frequencies greater than a rejection frequency that is less than twice the fundamental frequency, and (2) a notch filter response that attenuates frequencies within a first frequency range that includes the fundamental frequency.

22. The method of claim 21 further comprising:
    controlling the first frequency over a second frequency range; and
    controlling the first frequency range.

23. The method of claim 22 further comprising controlling the rejection frequency.

24. The method of claim 23 wherein the second frequency range is equal to or greater than one octave, and wherein the first frequency range includes a center frequency that is controlled over the second frequency range.

25. The method of claim 24 wherein the gating signal is provided such that it is a sinusoidal signal.

26. The method of claim 23 wherein the gating signal is provided such that it is a sinusoidal signal.

27. The method of claim 22 wherein the output signal is filtered such that the rejection frequency is greater than or equal to approximately 1.9 times the fundamental frequency.

28. A method comprising:
providing a gating signal to a single-photon avalanche diode, the gating signal being characterized by a fundamental frequency, and the gating signal being a non-sinusoidal signal; and
filtering an output signal provided by the single-photon avalanche diode with a filter having a filter response characterized by (1) a low-pass filter response that attenuates frequencies greater than a rejection frequency that is less than twice the fundamental frequency, and (2) a notch filter response that attenuates frequencies within a first frequency range that includes the fundamental frequency.

29. The method of claim 28 further comprising:
controlling the fundamental frequency over a second frequency range; and
controlling the first frequency range.

30. The method of claim 29 further comprising controlling the rejection frequency.

31. The method of claim 30 wherein the second frequency range is equal to or greater than one octave, and wherein the first frequency range includes a center frequency that is controlled over the second frequency range.

32. The method of claim 28 further comprising:
controlling each of the fundamental frequency, a center frequency, and the rejection frequency over a second frequency range that is equal to or greater than one octave, wherein the first frequency range is centered at the center frequency.

\* \* \* \* \*